United States Patent
Hong et al.

(10) Patent No.: US 11,143,673 B2
(45) Date of Patent: Oct. 12, 2021

(54) CAMERA MODULE INSPECTOR OF ROTATING TYPE DISTRIBUTING LOAD OF PROCESSING TEST RAW DATA

(71) Applicant: ISMEDIA CO., LTD., Anyang-si (KR)

(72) Inventors: Seong Cheol Hong, Yongin-si (KR); Jong Won Kim, Suwon-si (KR); DongChoon Kim, Daejeon (KR)

(73) Assignee: ISMEDIA CO., LTD, Anyang-si (KR)

( * ) Notice: Subject to any disclaimer, the term of this patent is extended or adjusted under 35 U.S.C. 154(b) by 217 days.

(21) Appl. No.: 16/513,290

(22) Filed: Jul. 16, 2019

(65) Prior Publication Data
US 2020/0141973 A1 May 7, 2020

(30) Foreign Application Priority Data
Nov. 7, 2018 (KR) .......................... 10-2018-0135777

(51) Int. Cl.
*G01R 1/04* (2006.01)
*G01R 31/28* (2006.01)
(Continued)

(52) U.S. Cl.
CPC ....... *G01R 1/0408* (2013.01); *G01R 31/2836* (2013.01); *G03B 43/00* (2013.01); *H04N 5/2253* (2013.01); *H04N 17/002* (2013.01)

(58) Field of Classification Search
CPC .............. G01R 1/0408; G01R 31/2836; G01R 31/282; G01R 31/00; H04N 17/002;
(Continued)

(56) References Cited

U.S. PATENT DOCUMENTS 7,427,768 B2 * 9/2008 Kim .................. H01L 27/14618
250/559.01
10,764,570 B2 * 9/2020 Hong ................... H04N 17/002
(Continued)

FOREIGN PATENT DOCUMENTS

KR 20090005816 * 7/2007
KR 10-1419683 7/2014
(Continued)

*Primary Examiner* — Vinh P Nguyen
(74) *Attorney, Agent, or Firm* — Westman, Champlin & Koehler, P.A.

(57) ABSTRACT

Disclosed is a camera module inspector of rotating type distributing a load of processing test raw data. In an exemplary embodiment, the camera module inspector of rotating type includes a rotary index table including a plurality of socket units, a plurality of testers arranged around the rotary index table, a plurality of test control processors connected to correspond to the plurality of socket units, respectively, to be fixed on the rotary index table, a network connection unit establishing network connections with respect to the plurality of test control processors, a redundancy check processor processing the test raw data faster than the test control processor, connected to the network connection unit and data controller test raw data requiring a great deal of processing time out of the test raw data generated in the plurality of test control processors to be transmitted to the redundancy check processor through the network connection unit.

7 Claims, 5 Drawing Sheets

(51) Int. Cl.
*H04N 5/225* (2006.01)
*H04N 17/00* (2006.01)
*G03B 43/00* (2021.01)

(58) Field of Classification Search
CPC .............. H04N 5/2253; G06F 11/2221; G03B 2215/0546; G03B 43/00; H03B 43/00; G01N 21/8806
See application file for complete search history.

(56) References Cited

U.S. PATENT DOCUMENTS

2013/0193984 A1\* 8/2013 Kim ..................... G01R 31/002
  324/613
2017/0316577 A1\* 11/2017 Kim ....................... G01B 11/26
2019/0313088 A1\* 10/2019 Hong ................... H04N 17/002

FOREIGN PATENT DOCUMENTS

KR    1014500684    \* 10/2014
KR    10-1552692     9/2015

\* cited by examiner

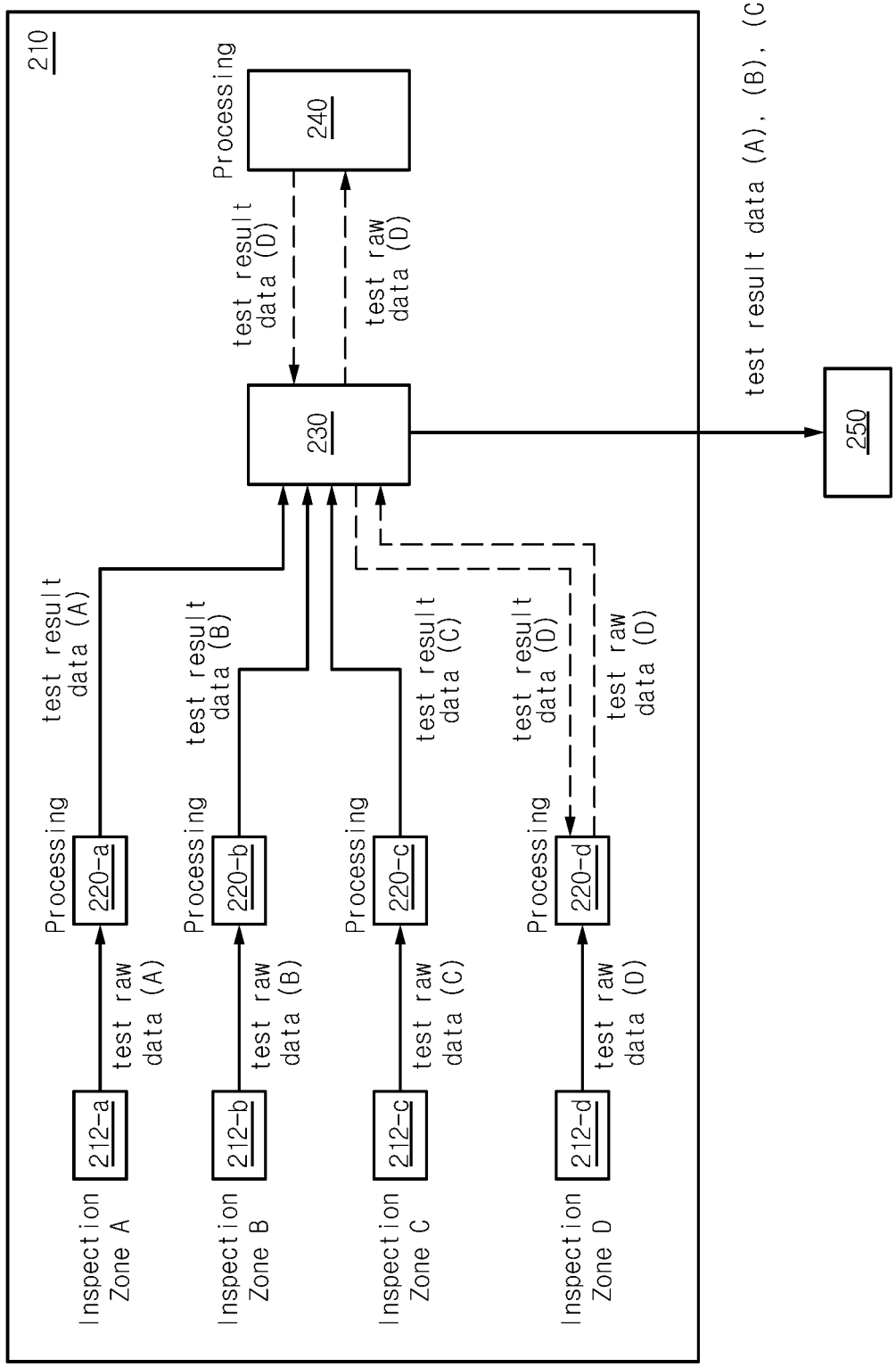
FIG. 3A  Example of data flow by data controller

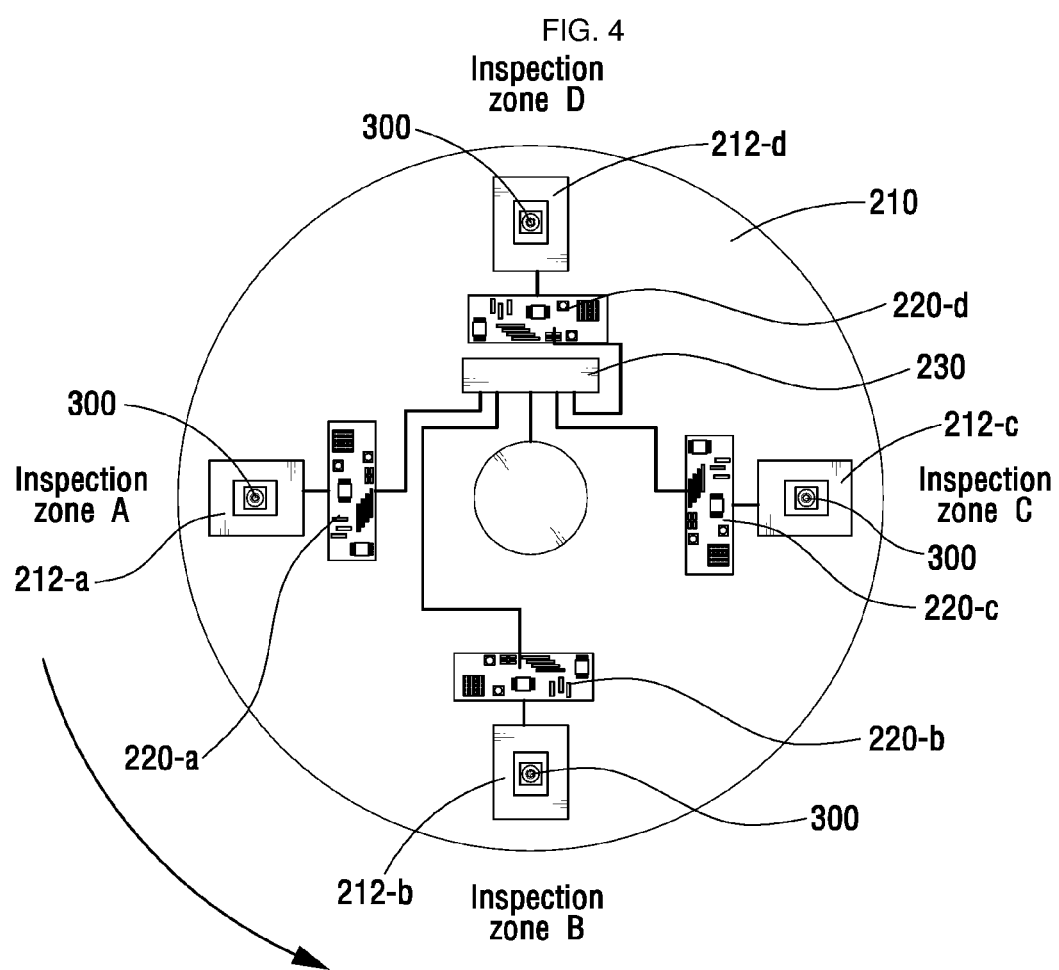

CAMERA MODULE INSPECTOR OF ROTATING TYPE DISTRIBUTING LOAD OF PROCESSING TEST RAW DATA

CROSS-REFERENCE TO RELATED APPLICATION

This application claims priority to and the benefit of Korean Patent Application No. 10-2018-0135777 filed on Nov. 22, 2018 in the Korean Intellectual Property Office, and all the benefits accruing therefrom under 35 U.S.C. 119, the contents of which in its entirety are herein incorporated by reference.

BACKGROUND

1. Field

The present invention relates to a camera module inspector of rotating type capable of distributing a load of processing test raw data, and more particularly, to the camera module inspector of rotating type having improved inspection efficiency, which performs tests on a plurality of camera modules with respect to a plurality of testers arranged around a rotary index table by rapidly and stably processing test raw data.

2. Description of the Related Art

In order to produce a camera module incorporated into a smartphone, a tablet PC, or a notebook computer, various components of the camera module are assembled and various tests are then performed to check whether the camera module is defective or not. In the tests for checking whether the camera module is defective or not, there are a wide variety of kinds of tests, including an open-short test, a focus adjustment test, a resolution test, an image defect test, and so on.

In order to increase inspection efficiency of such a camera module by reducing an inspection time and performing high-accuracy inspection, a camera module inspector of rotating type of performing inspection using various kinds of testers arranged around a rotatable rotary index table has been used in inspecting abnormality of assembled camera modules.

The operation of the camera module inspector of rotating type will be described in more detail. A plurality of camera modules are mounted in a plurality of socket units installed on the rotary index table, respectively, and different types of tests are simultaneously performed on the camera modules using testers arranged around the rotary index table. Inspection is performed such that when all of the tests being performed in a current inspection zone are completed, tests in a next inspection zone are subsequently performed by rotating the rotary index table.

Here, respective PCs of the testers for performing test controls of the camera modules mounted in the respective socket units need to exchange electrical signals concerning, for example, transmission of power supply and control signals and test raw data, with the camera modules. Conventionally, a plurality of the PCs positioned outside the rotary index table and a plurality of camera modules have been electrically connected using cables, respectively. In this case, unwanted twisting of cables may be caused due to rotation of the rotary index table.

To solve this problem, as shown in FIG. 1, Korean Patent Registration No. 10-1419683 discloses a camera module inspector of rotating type of performing inspection while performing optical communications with respective PCs(not shown) of testers positioned outside a rotary index table 110 using optical joint connection through a plurality of first non-contact type optical joints 115$a$ and 115$d$ provided on a rotating flange portion 112 positioned on a rotation axis of the rotary index table 110 on which multiple testing boards 111 for mounting camera modules are formed, and a plurality of second non-contact type optical joints 125$a$, 125$b$, 125$c$ and 125$d$ positioned on a fixed flange portion 122 facing the rotating flange portion 112.

However, the disclosed inspector is problematic in that data transmission is performed via complicated routes, i.e., between a camera module and an optical cable, between the optical cable and an optical joint, between the optical joint and another optical cable, between the optical cable and a PCI optical reception card, and between the PCI optical reception card and a PC of a tester. In addition, since the test raw data generated during inspection and transmitted to the PC is large capacity data, the non-contact type optical joint mechanism is not suitable for high-speed communication of such test raw data having a large capacity. In addition, as the number of optical channels is increased, the cost may dramatically increase. In addition, in a case where an optical axis alignment is not accurately established between the first non-contact type optical joint 115$a$ and 115$d$ and the second non-contact type optical joint 125$a$, 125$b$, 125$c$ and 125$d$, a data transmission error may be caused. Moreover, spatial efficiency may become poor by a plurality of PCs installed outside the rotary index table 110.

Thus, the present invention aims to propose a camera module inspector of rotating type, which can increase the inspection efficiency by solving problems associated with the conventional technology and reducing a load of processing test raw data to perform rapid and accurate inspection.

SUMMARY

The present invention has been made in an effort to solve the problems of the prior art, and one or more disclosed embodiments of the present invention provide a camera module inspector of rotating type having improved inspection efficiency, which can minimize electrical connections between the inspector and an externally installed inspector controller and can reduce the quantity of data transmitted, by network-connecting a plurality of test control processors fixed on a rotary index table so as to correspond to a plurality of camera modules mounted on the rotary index table and controlling inspection of the camera modules and processing generated test raw data and by transmitting the processed test result data having a reduced capacity to the external inspector controller, and can distribute a load of processing the test raw data generated during inspection throughout the network-connected test control processors.

The above and other features of the present invention will be described in or be apparent from the following description of the preferred embodiments.

According to an aspect of the present invention, there is provided a camera module inspector of rotating type distributing a load of processing test raw data, the camera module inspector of rotating type including a rotary index table including a plurality of socket units on which camera modules are mounted and making rotational movement, a plurality of testers arranged around the rotary index table and performing tests on the camera modules, a plurality of test control processors connected to correspond to the plurality of socket units, respectively, to be fixed on the rotary index table, controlling the tests for the camera modules mounted on the socket units and processing test raw data generated during the tests, a network connection unit establishing network connections with respect to the plurality of test control processors, a redundancy check processor processing the test raw data faster than the test control processor, connected to the network connection unit, fixed on the rotary index table, and receiving the test raw data from at least one of the plurality of test control processors and processing the received test raw data and data controller controlling test raw data requiring a great deal of processing time out of the test raw data generated in the plurality of test control processors to be transmitted to the redundancy check processor through the network connection unit to then be processed by the redundancy check processor.

Here, the camera module inspector of rotating type may further include an inspector controller positioned outside the rotary index table, receiving test result data processed by the test control processor from the network connection unit and controlling an overall operation of the camera module inspector of rotating type.

Here, the inspector controller may be connected to the network connection unit through a rotation axis of the rotary index table.

Here, the inspector controller may be connected to the network connection unit by a single optical joint connection being formed on the rotation axis of the rotary index table.

Here, after the lapse of a predetermined time once all of the test raw data are generated in the plurality of test control processors, the inspector controller may control to perform the next test by rotating the rotary index table, irrespective of whether processing of the test raw data is completed or not.

Here, the test control processor may be configured sequentially to process the test raw data generated while the rotary index table is rotating in order of test raw data generated.

Here, the test control processor may be configured to process the test raw data generated a previous inspection zone even during rotating movement of the rotary index table or in a standby state after the rotating movement of the rotary index table.

As described above, in the camera module inspector of rotating type capable of distributing a load of processing test raw data according to the present invention, since the test raw data is processed by a test control processor fixed on a rotary index table and test result data having a reduced capacity is then transmitted to an inspector controller installed outside the rotary index table, the test result data can be rapidly transmitted.

In addition, since the test raw data is processed by a test control processor fixed on a rotary index table and the processed test result data is transmitted to the inspector controller installed outside the rotary index table through a single electrical connection (e.g., an optical joint connection), problems of cable twisting or cost rising due to an increased number of optical cables can be overcome.

In addition, a high-performance redundancy check processor having a high data processing speed is positioned on a network connection unit establishing network-connections with respect to a plurality of test control processors to allow the redundancy check processor to process test raw data requiring a considerable time to be processed, thereby distributing a load of processing the test raw data throughout inspection zones, thereby improving inspection efficiency.

In addition, according to the present invention, the next test is performed by rotating the rotary index table after the lapse of a predetermined time once all of the test raw data are generated in the plurality of test control processors, rather than by rotating the rotary index table after completing the processing of all of the test raw data in the plurality of test control processors, and the plurality of test control processors are allowed to process the test raw data generated in the previous inspection zone even during rotating movement of the rotary index table or in a standby state after the rotating movement of the rotary index table by rotating the rotary index table in order of test raw data generated, thereby reducing the time required for processing the test raw data.

In addition, the respective test control processors fixed on the rotary index table may control the tests in all of the inspection zones and may process the test raw data while rotating the rotary index table. Therefore, even a test that is dependent on the test result of the previous inspection zone can be rapidly performed without separate data transmission because the test result data of the previous inspection zone is stored in the test control processor.

The present summary is provided only by way of example, and not limitation. Other aspects of the present invention will be appreciated in view of the entirety of the present disclosure, including the entire text, claims and accompanying figures.

BRIEF DESCRIPTION OF THE DRAWINGS

FIG. 3A is a schematic block diagram of data flow control by a data processor in the rotary index table of the camera module inspector shown in FIG. 3.

FIG. 4 is a plan view of a rotary index table, illustrating a method of reducing a processing time of test raw data according to another embodiment of the present invention.

Figure 1:
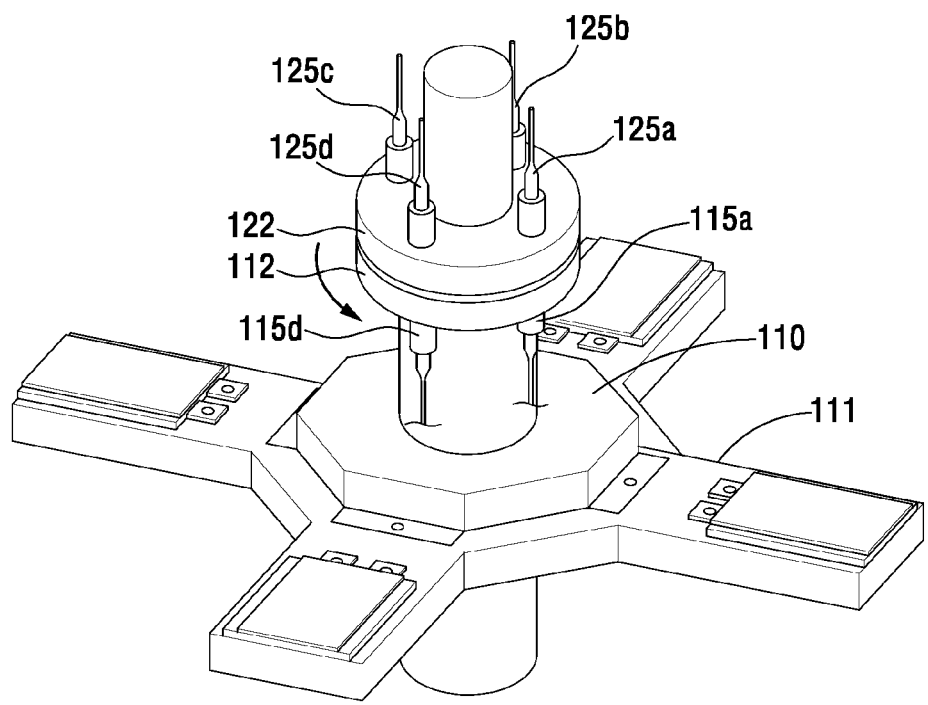
FIG. 1 is a perspective view of a conventional camera module inspector of rotating type with a plurality of optical joint connections.

While the above-identified figures set forth one or more embodiments of the present invention, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features, steps and/or components not specifically shown in the drawings.

DETAILED DESCRIPTION

Hereinafter, the present invention will be described in detail.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like numbers refer to like elements throughout.

Hereinafter, a camera module inspector of rotating type capable of distributing a load of processing test raw data according to embodiments of the present invention will be described with reference to the accompanying drawings.

Figure 2:
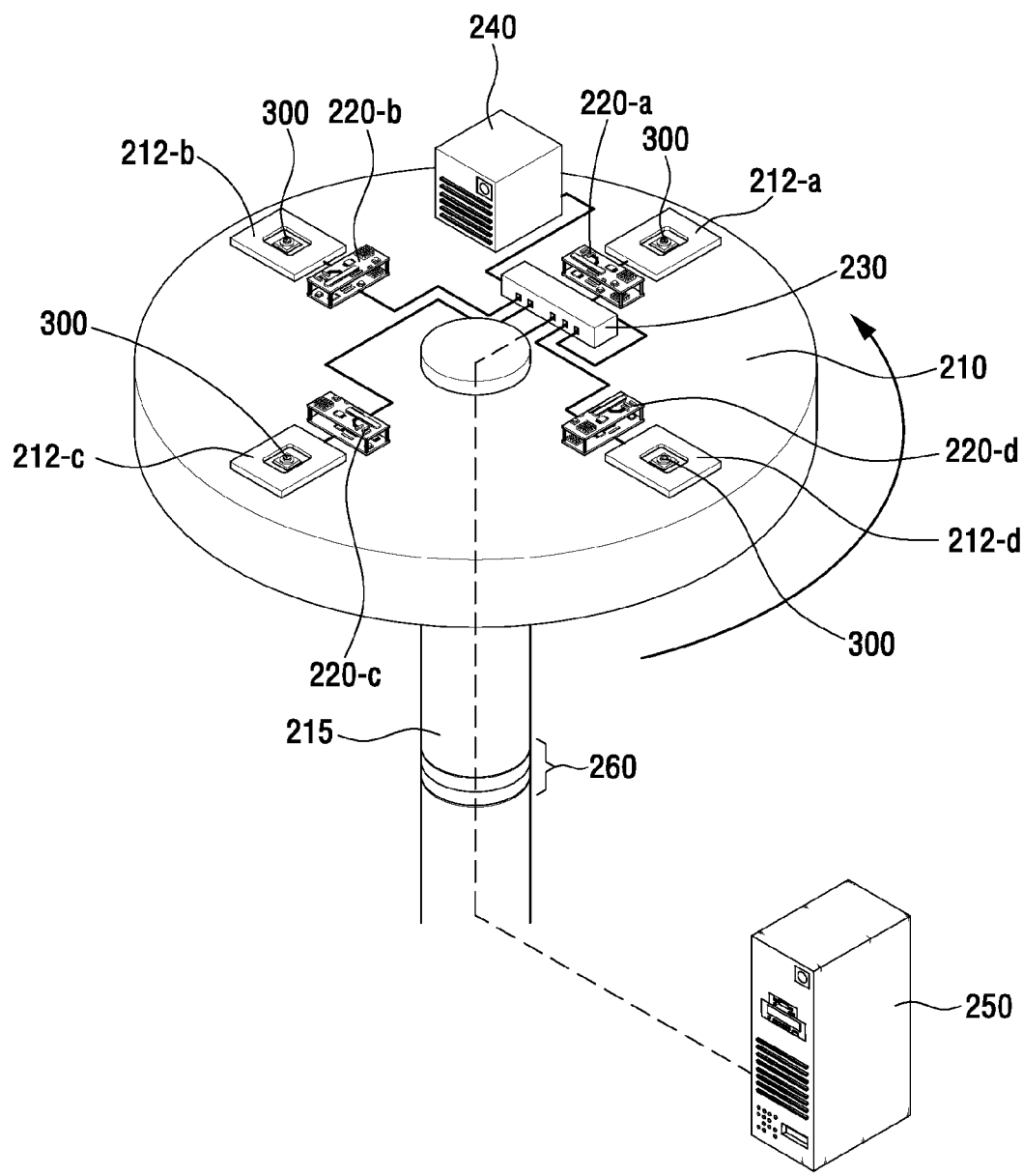
FIG. 2 is a schematic perspective view of a camera module inspector of rotating type capable of distributing a load of processing test raw data according to an embodiment of the present invention.
Figure 3:
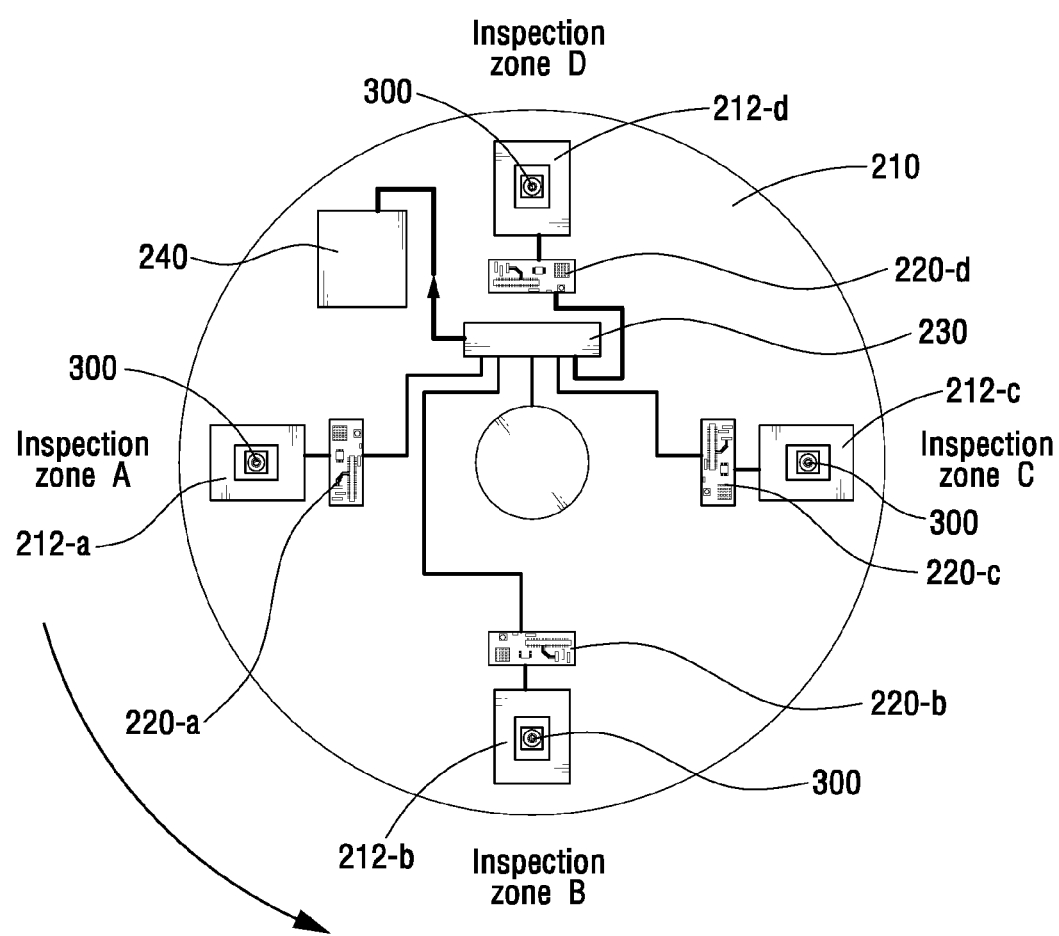
FIG. 3 is a plan view of a rotary index table shown in FIG. 2, illustrating a structure for distributing a load of processing test raw data according to an embodiment of the present invention.

FIG. 2 is a schematic perspective view of a camera module inspector of rotating type capable of distributing a load of processing test raw data according to an embodiment of the present invention. FIG. 3 is a plan view of a rotary index table shown in FIG. 2, illustrating a structure for distributing a load of processing test raw data according to an embodiment of the present invention. FIG. 4 is a plan view of a rotary index table, illustrating a method of reducing a processing time of test raw data according to another embodiment of the present invention.

The rotating camera module inspector capable of distributing a load of processing test raw data according to the present invention may include a rotary index table 210, a plurality of testers (not shown), a plurality of test control processors 220, a network connection unit 230 and a redundancy check processor 240.

The rotary index table 210 rotates 360 degrees about a rotation axis using driving power derived from, for example, a motor, and a plurality of camera modules 300 are mounted on the rotary index table 210 on which various types of tests are performed. Here, the plurality of camera modules 300 are equidistantly arranged around a circumference of the rotary index table 210, and socket units 212 are installed on a top surface of the rotary index table 210 to mount the camera modules 300 therein.

In the illustrated embodiment, four camera modules 300 arranged around a circumference at an equal angular distance of 90 degrees, but aspects of the present invention are not limited thereto. Rather, more than four camera modules 300 may be equidistantly arranged to be inspected.

The testers(not shown) may include different kinds of testers for inspecting the camera modules 300 mounted on the rotary index table 210 and may be equidistantly arranged around a circumference of the rotary index table 210 to establish inspection zones.

Therefore, the plurality of camera modules 300 mounted on the rotary index table 210 are arranged to correspond to the testers positioned around the rotary index table 210, respectively, so as to simultaneously perform different kinds of tests. If a series of tests are completed in the respective inspection zones, the rotary index table 210 is rotated to allow the respective camera modules 300 to be inspected in the tester positioned in the next neighboring inspection zone. In this way, all of inspections can be performed in all of the testers arranged around the rotary index table 210.

The testers for inspecting the camera modules 300 may include a variety of devices for inspecting the camera modules 300 as completely assembled products, including, for example, an open-short tester, a focus adjustment tester, a resolution tester, an image defect tester, and so on, which may be known testing devices for inspecting the camera modules 300. In the specification of the present invention, specific configurations of the respective testers will not be described in detail.

The test control processor 220 may include a plurality of test control processors fixed on the rotary index table 210 so as to correspond to the plurality of socket units 212, respectively, to then be electrically connected to the respective camera modules 300 through the socket units 212. The test control processor 220 controls tests performed by the testers on the camera modules 300 mounted in the socket units 212 and processes test raw data generated during the tests.

Since the inspection of the camera modules 300 is performed while checking whether the camera modules 300 properly operate under various conditions, like in a case where they are mounted in and used with smartphones, etc., the test control processors 220 control the camera modules 300 according to various conditions. In addition, the test control processors 220 may store the test raw data generated during the tests performed by the testers, including a variety of test raw data, for example, a short-distance photograph image, a long-distance photograph image, a dark room photograph image, a white background photograph image, or electric resistance values of the camera modules 300, and may process the generated test raw data to obtain test result data concerning defects of the camera modules 300. Here, the test raw data including many pieces of image data may be massive data. However, the test result data generated after processing the test raw data may have a considerably reduced capacity.

Therefore, the test control processor 220 may be fabricated as a personal computer (PC) that executes tester control, data storage, data processing, and so on, preferably as a small-sized PC in the form of a single board computer (SBC) including components for performing storage, interface, operations, and so on, mounted on a single circuit board.

The network connection unit 230 may network-connect the plurality of test control processors 220 and is preferably fixed on the rotary index table 210, like the test control processors 220. In addition, the network connection unit 230 may also network-connect the redundancy check processor 240, which will later be described. Moreover, the network connection unit 230 may be electrically connected to the inspector controller 250 positioned outside the rotary index table 210 to perform data transmission and reception, which will later be described.

The network connection unit 230 preferably connects to the test control processors 220 and the redundancy check processor 240 via a high-speed network using optical cable communication for the purpose of minimizing the time required for transceiving large capacity test raw data between the test control processor 220 and the redundancy check processor 240 to distribute a load of processing the test raw data, which will later be described.

The redundancy check processor 240 may be network-connected to the network connection unit 230 and may be fixed on the rotary index table 210, like the test control processors 220. Here, the redundancy check processor 240 may receive test raw data from at least one among the plurality of test control processors 220 and may process the same to generate test result data.

The time required for each of the test control processors 220 processing test raw data in each inspection zone is not equal, and there are even cases where some of the test control processors 220 may require more than double the time required for one of the test control processors 220 processing the test raw data. For example, as shown in FIG. 3, in a case where it is necessary for the test control processor 220-d to process the test raw data in an inspection zone D, in which a great deal of processing time is required, even after processing of the test raw data in an inspection zone A is completed in the test control processor 220-a and the test is terminated, the test control processor 220-a in the inspection zone A may unnecessarily be in a standby situation. Therefore, in the present invention, a data controller (see FIG. 3A) may control the test raw data requiring a great deal of processing time, out of various pieces of the test raw data generated in the respective inspection zones, that is transmitted to the redundancy check processor 240 having better performance and a high data processing speed than the test control processor 220 and then proceeded by the redundancy check processor 240, thereby reducing the processing time of the test raw data.

Therefore, as shown in FIGS. 3 and 3A, by the data controller, the test raw data generated in the inspection zone D, in which a great deal of data processing time is required, may be transmitted from the test control processor 220-d to the redundancy check processor 240 at a high speed through the network connection unit 230 to then be processed by the redundancy check processor 240, while the test raw data generated in the other inspection zones, in which a lot of time is not required in processing the test raw data, may be directly processed by the test control processors 220-a, 220-b, and 220-c.

While a single redundancy check processor 240 is provided in the present embodiment, a plurality of redundancy check processors 240 may be provided in some cases. As described above, according to the present invention, the high-performance redundancy check processor 240 is separately connected to the network connection unit 230 to distribute a load of processing the test raw data requiring a much inspection load so as to be separately processed in the redundancy check processor 240, thereby reducing the time required for completing all of the tests performed in the plurality of inspection zones.

The test result data processed in the redundancy check processor 240 may be transmitted back to the test control processor 220 of the inspection zone D, from which the test raw data is transmitted.

The inspector controller 250 may also be fabricated as a PC, like the test control processor 220 and the redundancy check processor 240. The inspector controller 250 may be positioned outside the rotary index table 210 to be electrically connected to the network connection unit 230 to receive the processed test result data from the test control processor 220 and may classify, store and display the test result data. Moreover, the inspector controller 250 may also perform a function of controlling the overall operation of the inspector according to the present invention, including, for example, rotation of the rotary index table 210. Additionally, the inspector controller 250 may include a separator display device of displaying the test result data to allow an operator to easily identify the test result data.

Therefore, according to the present invention, since the network connection unit 230 and the inspector controller 250 are electrically connected, the capacity-reduced test result data processed by the test control processor 220 or the redundancy check processor 240 fixed on the rotary index table 210 is transmitted/received, and control signals for driving the inspector are transmitted/received, the number of electrical connection channels between the network connection unit 230 and the inspector controller 250 can be minimized.

In the present embodiment, as shown in FIG. 2, since the network connection unit 230 installed on the rotary index table 210 and the inspector controller 250 are electrically connected to each other through the single-channel optical joint 260 on the rotation axis 215 of the rotary index table 210, a problem of a cost increase due to multi-channel optical joint connection can be solved. Here, since the data transmitted between the network connection unit 230 and the inspector controller 250 has a small data volume, the network connection unit 230 and the inspector controller 250 may be directly connected using an optical cable. Furthermore, the network connection unit 230 and the inspector controller 250 may also be fabricated to transceiver data wirelessly.

Next, a method for reducing the time required for all of the tests performed in the plurality of inspection zones in the present invention will be described with reference to FIG. 4. The redundancy check processor 240 is not provided in FIG. 4, unlike in FIG. 3, and may be fabricated as a medium-level computer having higher performance than the test control processor 220 fabricated in the form of a single board computer (SBC), which is provided by way of example for a better understanding the concept of the present invention, but aspects of the present invention are not limited thereto. That is to say, manufactured in the same manner as shown in FIG. 3, controlling operation of processing the test raw data using a redundancy check processor 240 as described above and the following controlling operation may be simultaneously performed.

If the rotary index table 210 is rotated to reach positions of the respective testers and comes to a stop, different kinds of tests are performed in the respective inspection zones. Here, the respective test control processors 220 store the generated test raw data. The respective test control processor 220 may differ in the time required for generating the test raw data and storing the same. In addition, as described above, the respective test control processors 220 may also differ in the time required for processing the generated test raw data.

In the present embodiment, the inspector controller 250 may control the test raw data to be generated for the next test in the next inspection zone by rotating the rotary index table 210 after the lapse of a predetermined time once generation of all of the test raw data is completed in the test control processors 220 of the respective inspection zones, irrespective of whether processing of the test raw data is completed or not, instead of rotating the rotary index table 210 to perform the next test in the next inspection zone after generating all of the test raw data in the plurality of inspection zones and then completely processing all of the test raw data in the respective inspection zones. Here, a reference time point of rotating the rotary index table 210 may be determined as a time point when the processing of the test raw data in one among the plurality of inspection zones, for example, but aspects of the present invention are not limited thereto. However, generation of all of the test raw data in the plurality of inspection zones should be completed, and the rotary index table 210 should be rotated after the generation is completed.

As described above, according to the present invention, once the test raw data is generated in all of the inspection zones, the test raw data in the next inspection zone may be generated by rotating the rotary index table 210, irrespective of whether the processing of the generated test raw data is completed or not. Here, the test raw data generated the previous test zone may be processed even during rotating movement of the rotary index table 210 or in a standby state after the rotating movement of the rotary index table 210.

In the conventional camera module inspector of rotating type shown in FIG. 1, since a position of the respective PCs of testers which are installed outside the rotary index table 110 is fixed at a position of corresponding tester, the respective PCs of testers can perform only one test of the corresponding tester even if the rotary index table 110 is rotated. In the camera module inspector of rotating type according to the present invention, however, since the respective test control processors 220 fixed on the rotary index table 210 perform tests in all of the inspection zone while moving together with rotating of the rotary index table 210, they may store the test raw data of the previous inspection zone as well. Therefore, the respective test control processors 220 may process the test raw data of the previous inspection zone even while moving to the next inspection zone.

Here, the test control processors 220 preferably sequentially process the test raw data generated in the respective inspection zones in order of test raw data generated.

Accordingly, in the present invention, the test raw data may be processed even during rotating movement of the rotary index table 210 or in a standby state after the rotating movement of the rotary index table 210, which is unrelated to generation of the test raw data, thereby reducing the overall inspection time of the camera modules 300 mounted on the rotary index table 210 for all of the inspection zones A, B, C and D.

For example, assuming that the inspection time 'a' required in the inspection zone A is smallest and the inspection time 'd' required in the inspection zone D is largest, if the next test is performed in the next inspection zone by rotating the rotary index table 210 after completing the tests in all of the inspection zones, the processing of the test raw data in the inspection zone D is still ongoing even after the processing of the test raw data in the inspection zone A is completed, the inspection zone A unnecessarily be in a standby situation. Therefore, the total inspection time may become 4×d, which is required for one of the camera modules 300 being inspected in all of the inspection zones A, B, C and D while rotating 360 degrees.

However, as described above, according to the present invention, even if the processing of the tests in all of the inspection zones is not completed, the test raw data of the next inspection zone is generated by rotating the rotary index table 210 after the lapse of a predetermined time once the generation of the test raw data is completed. Then, the processing of the previously generated test raw data is subsequently performed during rotating movement or in a standby state of the rotary index table 210, thereby reducing an unnecessary standby time and ultimately reducing the total inspection time.

While the present invention has been particularly shown and described with reference to exemplary embodiments thereof, it will be understood by those of ordinary skill in the art that various changes in form and details may be made therein without departing from the spirit and scope of the present invention as defined by the following claims.

EXPLANATION OF REFERENCE NUMERALS

210: Rotary index table
212: Socket units
215: Rotation axis
220: Test control processors
230: Network connection unit
240: Redundancy check processor
250: Inspector controller
260: Optical joint
300: Camera modules

What is claimed is:

1. A camera module inspector of rotating type, which is capable of distributing a load of processing test raw data, the camera module inspector of rotating type comprising:
   a rotary index table including a plurality of socket units on which camera modules are mounted and making rotational movement;
   a plurality of testers arranged around the rotary index table and performing tests on the camera modules;
   a plurality of test control processors connected to correspond to the plurality of socket units, respectively, to be fixed on the rotary index table, controlling the tests for the camera modules mounted on the socket units and processing test raw data generated during the tests;
   a network connection unit establishing network connections with respect to the plurality of test control processors; and
   a redundancy check processor processing the test raw data faster than the test control processor, connected to the network connection unit, fixed on the rotary index table, and receiving the test raw data from at least one of the plurality of test control processors and processing the received test raw data;
   wherein test raw data requiring a great deal of processing time out of the test raw data generated in the plurality of test control processors is transmitted to the redundancy check processor through the network connection unit to then be processed by the redundancy check processor.

2. The camera module inspector of rotating type of claim 1, further comprising an inspector controller positioned outside the rotary index table, receiving test result data processed by the test control processor from the network connection unit and controlling an overall operation of the camera module inspector of rotating type.

3. The camera module inspector of rotating type of claim 2, wherein the inspector controller is connected to the network connection unit through a rotation axis of the rotary index table.

4. The camera module inspector of rotating type of claim 3, wherein the inspector controller is connected to the network connection unit by a single optical joint connection being formed on the rotation axis of the rotary index table.

5. The camera module inspector of rotating type of claim 2, wherein after the lapse of a predetermined time once all of the test raw data are generated in the plurality of test control processors, the inspector controller controls to perform the next test by rotating the rotary index table, irrespective of whether processing of the test raw data is completed or not.

6. The camera module inspector of rotating type of claim 5, wherein the test control processor is configured sequentially to process the test raw data generated while the rotary index table is rotating in order of test raw data generated.

7. The camera module inspector of rotating type of claim 6, wherein the test control processor is configured to process the test raw data generated in a previous inspection zone even during rotating movement of the rotary index table or in a standby state after the rotating movement of the rotary index table.

* * * * *